United States Patent
Aziz et al.

(10) Patent No.: US 8,183,885 B2
(45) Date of Patent: May 22, 2012

(54) CIRCUIT FOR DIGITALLY CONTROLLING LINE DRIVER CURRENT

(75) Inventors: Joseph Aziz, Irvine, CA (US); Andrew Chen, Redondo Beach, CA (US); Ark-Chew Wong, Irvine, CA (US); Derek Tam, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/384,795

(22) Filed: Apr. 8, 2009

(65) Prior Publication Data

US 2010/0259300 A1 Oct. 14, 2010

(51) Int. Cl.
*H03K 19/094* (2006.01)
(52) U.S. Cl. ............. 326/86; 326/83; 327/109; 341/145
(58) Field of Classification Search .............. 326/82–83, 326/86; 327/108–109; 341/144–145
See application file for complete search history.

(56) References Cited

U.S. PATENT DOCUMENTS

| | | | |
|---|---|---|---|
| 6,466,100 B2 * | 10/2002 | Mullgrav et al. | 331/179 |
| 6,580,760 B1 * | 6/2003 | Larsen | 375/257 |
| 6,888,482 B1 * | 5/2005 | Hertle | 341/120 |
| 7,254,173 B1 * | 8/2007 | Fu et al. | 375/233 |
| 7,394,857 B2 * | 7/2008 | Maulik et al. | 375/257 |
| 7,417,463 B1 * | 8/2008 | Danesh et al. | 326/86 |
| 2002/0018534 A1 * | 2/2002 | Sevenhans et al. | 375/354 |
| 2002/0048109 A1 * | 4/2002 | Chaiken et al. | 360/67 |
| 2003/0038740 A1 * | 2/2003 | Mulder et al. | 341/144 |
| 2004/0140830 A1 * | 7/2004 | Mulder et al. | 327/65 |
| 2004/0201416 A1 * | 10/2004 | Wyers et al. | 330/2 |
| 2007/0018867 A1 * | 1/2007 | Uemori et al. | 341/143 |
| 2008/0079501 A1 * | 4/2008 | Hulfachor et al. | 331/16 |
| 2008/0079510 A1 * | 4/2008 | Seethamraju et al. | 331/179 |
| 2008/0111639 A1 * | 5/2008 | Ryckaert et al. | 331/57 |
| 2010/0213983 A1 * | 8/2010 | Eschauzier et al. | 327/65 |
| 2010/0237910 A1 * | 9/2010 | Mukhopadhyay et al. | 327/108 |

* cited by examiner

*Primary Examiner* — Jason M Crawford
(74) *Attorney, Agent, or Firm* — Farjami & Farjami LLP

(57) ABSTRACT

In one embodiment, a circuit for providing a tail current for a line driver includes an adjustable current source. The adjustable current source includes a number of current source cells coupled together in a parallel configuration, where the current source cells are configured to provide the tail current for the line driver in response to a digital control signal. The circuit can further include a digital core coupled to the adjustable current source, where the digital core provides the digital control signal. The digital control signal provides a number of bits, where each bit controls one of the current source cells. In one embodiment, a current source cell can comprise a number of current source sub-cells. The current source cells can be configured to provide the tail current for the line driver in response to the digital control signal when the line driver is operating in a class AB mode.

20 Claims, 5 Drawing Sheets

(Prior Art)

CIRCUIT FOR DIGITALLY CONTROLLING LINE DRIVER CURRENT

BACKGROUND OF THE INVENTION

1. Field of the Invention

The present invention is generally in the field of electrical circuits. More particularly, the invention is in the field of line drivers for transmission lines.

2. Background Art

Line drivers, such as current mode line drivers, can be utilized in set-top boxes, cable modems, routers, computer interfaces, and other electronic devices to drive transmission lines, such as Ethernet transmission lines. For a line driver, such as a current mode line driver, a tail current source can provide a tail current for generating an output signal during line driver operation. The tail current source needs to provide a sufficient amount of tail current to enable the output signal generated by the line driver to reach a desired maximum amplitude. However, it is important to effectively control the amount of tail current provided to the line driver by the tail current source so as to avoid undesirably increasing line driver current consumption.

Conventionally, a tail current source for providing a tail current for a line driver, such as a current mode line driver, can include, for example, a pair of field effect transistors (FETs) coupled in series between a node of the line driver and ground. A bias circuit can be configured to provide a bias voltage at the gate of each FET in response to a pair of bias currents supplied to the bias circuit. By controlling the bias voltages provided at the gates of the FETs by the bias circuit, the tail current provided for the line driver by the conventional tail current source can also be controlled. However, it is difficult for the bias circuit to effectively and accurately control the tail current provided by the conventional tail current source, which can result in an undesirable increase in line driver current consumption.

SUMMARY OF THE INVENTION

A circuit for digitally controlling line driver current is provided. Features, advantages and various embodiments of the present invention are shown in and/or described in connection with at least one of the drawings, as set forth more completely in the claims.

DETAILED DESCRIPTION OF THE INVENTION

The present invention is directed to a circuit for digitally controlling line driver current. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
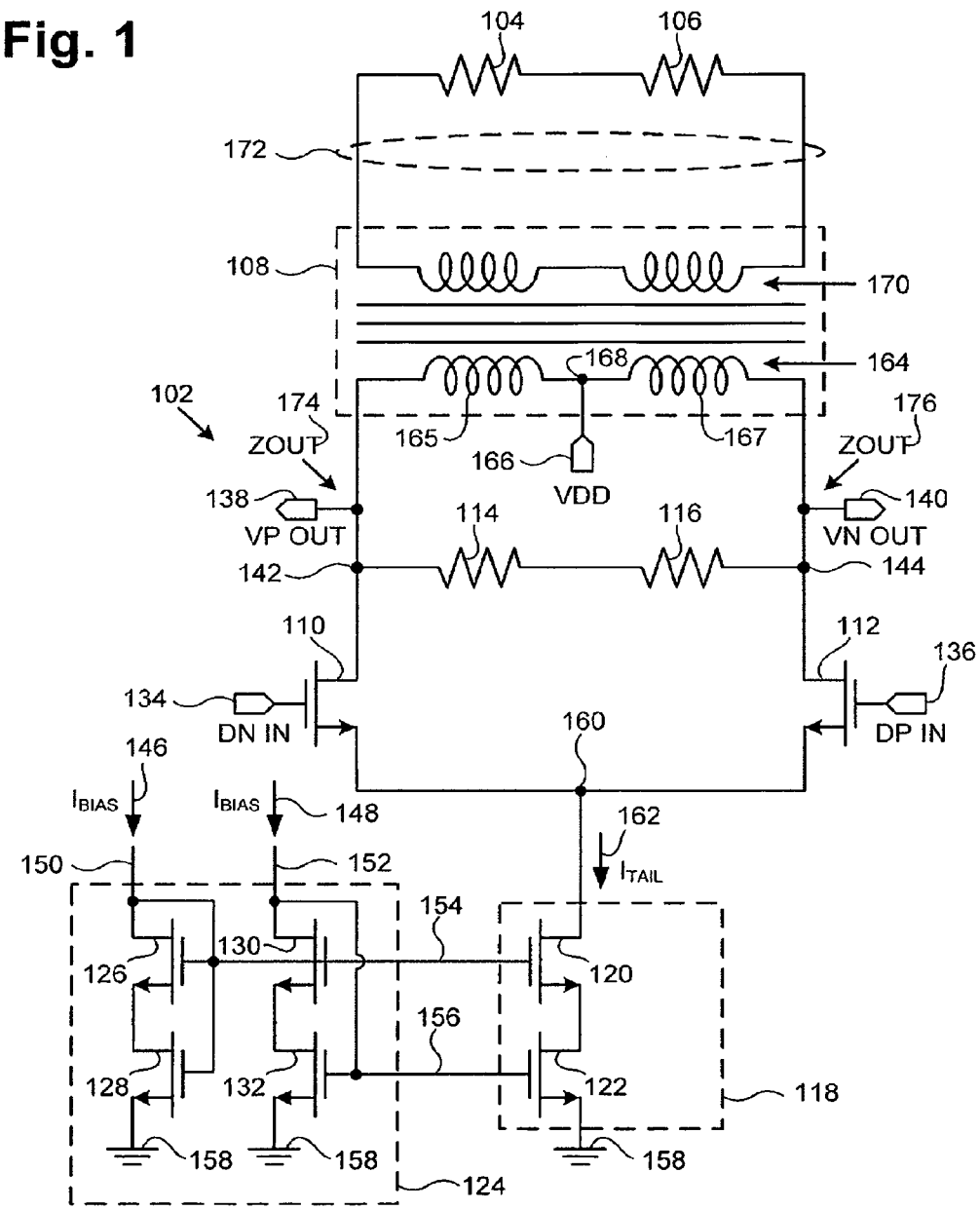
FIG. 1 illustrates a circuit diagram of an exemplary line driver including an exemplary conventional tail current source.

FIG. 1 shows a circuit diagram of an exemplary line driver including an exemplary conventional tail current source. In FIG. 1, line driver 102 is coupled to termination resistors 104 and 106 via transformer 108. Termination resistors 104 and 106 can represent, for example, an RJ45 Ethernet port in a receiver module. Line driver 102, which can be an open-drain current mode line driver, includes transistors 110 and 112, termination resistors 114 and 116, conventional tail current source 118 (also referred to as a "tail current sink"), which includes transistors 120 and 122, and bias circuit 124, which includes transistors 126, 128, 130, and 132. Line driver 102 can be utilized in set-top boxes, cable modems, routers, computers, and other electronic devices to drive transmission lines, such as Ethernet transmission lines. Conventional line driver 102 can be fabricated on a semiconductor die (also referred to as a "chip" or simply as a "die" in the present application).

Conventional line driver 102 can be configured receive data negative input (DN IN) 134 and data positive input (DP IN) 136 and can provide voltage positive output (VP OUT) 138 and voltage negative output (VN OUT) 140, where VP OUT 138 and VN OUT 140 are differential outputs. DN IN 134 and DP IN 136 are digital inputs, where DN IN 134 is the complement of DP IN 136. Also, data can be inputted into conventional line driver 102 as a digital word comprising multiple bits, where each bit and its complement can be inputted into respective transistors, such as transistors 112 and 110, which are coupled to a tail current source, such as conventional tail current source 118. Thus, for a digital word comprising 16 bits, the configuration of transistors 112 and 110 and tail current sink 118 can be repeated 16 times, where the drain of each transistor (e.g. transistor 112) receiving a bit of the digital word can be coupled to node 144, the drain of each transistor (e.g. transistor 110) receiving a complementary bit of the digital word can be coupled to node 142, and each tail current source, such as conventional tail current source 118, can be coupled to bias circuit 124.

As shown in FIG. 1, bias circuit 124 receives bias current ($I_{BIAS}$) 146 and $I_{BIAS}$ 148 on respective lines 150 and 152 and provides bias voltages for respective transistors 120 and 122 of conventional tail current source 118 on lines 154 and 156. Also shown in FIG. 1, transistors 126 and 128 are coupled in series between line 150 and ground 158 and transistors 130 and 132 are coupled in series between line 152 and ground 158, where transistors 126, 128, 130, and 132 can each be an N-channel field effect transistor (NFET). Further shown in FIG. 1, transistors 120 and 122, which can be NFETs, are coupled in series between ground 158 and node 160, at which the sources of transistors 110 and 112 are coupled.

Also shown in FIG. 1, the drains of transistors 110 and 112 are coupled to respective nodes 142 and 144, which provide VP OUT 138 and VN OUT 140, termination resistors 114 and 116 are coupled in series between nodes 142 and 144, and DN IN 134 and DP IN 136 are coupled to the respective gates of transistors 110 and 112, which can be NFETs. Termination resistors 114 and 116 can provide on-chip passive termination for line driver 102 and can each have a resistance equal to, for example, approximately 50.0 ohms. Further shown in FIG. 1, primary winding 164 of transformer 108 is coupled across nodes 142 and 144, supply voltage 166 (i.e. VDD) is coupled to the center tap of primary winding 164 at node 168, and termination resistors 104 and 106 are coupled in series across secondary winding 170 of transformer 108 via transmission line 172, which can be an Ethernet transmission line. Termination resistors, which can each be equal to approximately 50.0 ohms, can represent, for example, an RJ45 Ethernet port in a receiver module. Primary winding 164 includes inductors 165 and 167, which provide VDD to the drains of respective transistors 110 and 112.

Line driver 102 can provide output impedance (ZOUT) 174 at node 142 and ZOUT 176 at node 144 as required to match the characteristic impedance of the transmission line that the line driver is driving, such as transmission line 172. For example, ZOUT 174 and ZOUT 176 can each be equal to approximately 50.0 ohms. The output impedance of line driver 102 can be provided through on-chip passive termination provided by termination resistors 114 and 116, which are coupled between output nodes 142 and 144. Termination resistors 114 and 116 can provide an output impedance between differential outputs VP OUT 138 and VN OUT 140 at respective nodes 142 and 144 that can be equal to, for example, approximately 100.0 ohms.

During operation of line driver 102, conventional current source 118 provides tail current ($I_{TAIL}$) 162, which is utilized to generate VP OUT 138 and VN OUT 140. $I_{TAIL}$ 162 is sunk from supply voltage 166 (i.e. VDD) by transistors 120 and 122 of conventional current source 118. When line driver 102 is transmitting data, $I_{TAIL}$ 162 flows through either transistor 110 or transistor 112, depending on which transistor is turned on by the inputted data (i.e. DN IN 134 and DP IN 136). $I_{TAIL}$ 162 can be controlled by bias voltages on lines 154 and 156, which are provided by bias circuit 124 in response to $I_{BIAS}$ 146 and $I_{BIAS}$ 148. However, it can be difficult for bias circuit 124 to effectively and accurately control $I_{TAIL}$ 162 provided by conventional current source 118, which can result in an undesirable increase in line driver current consumption.

Figure 2:
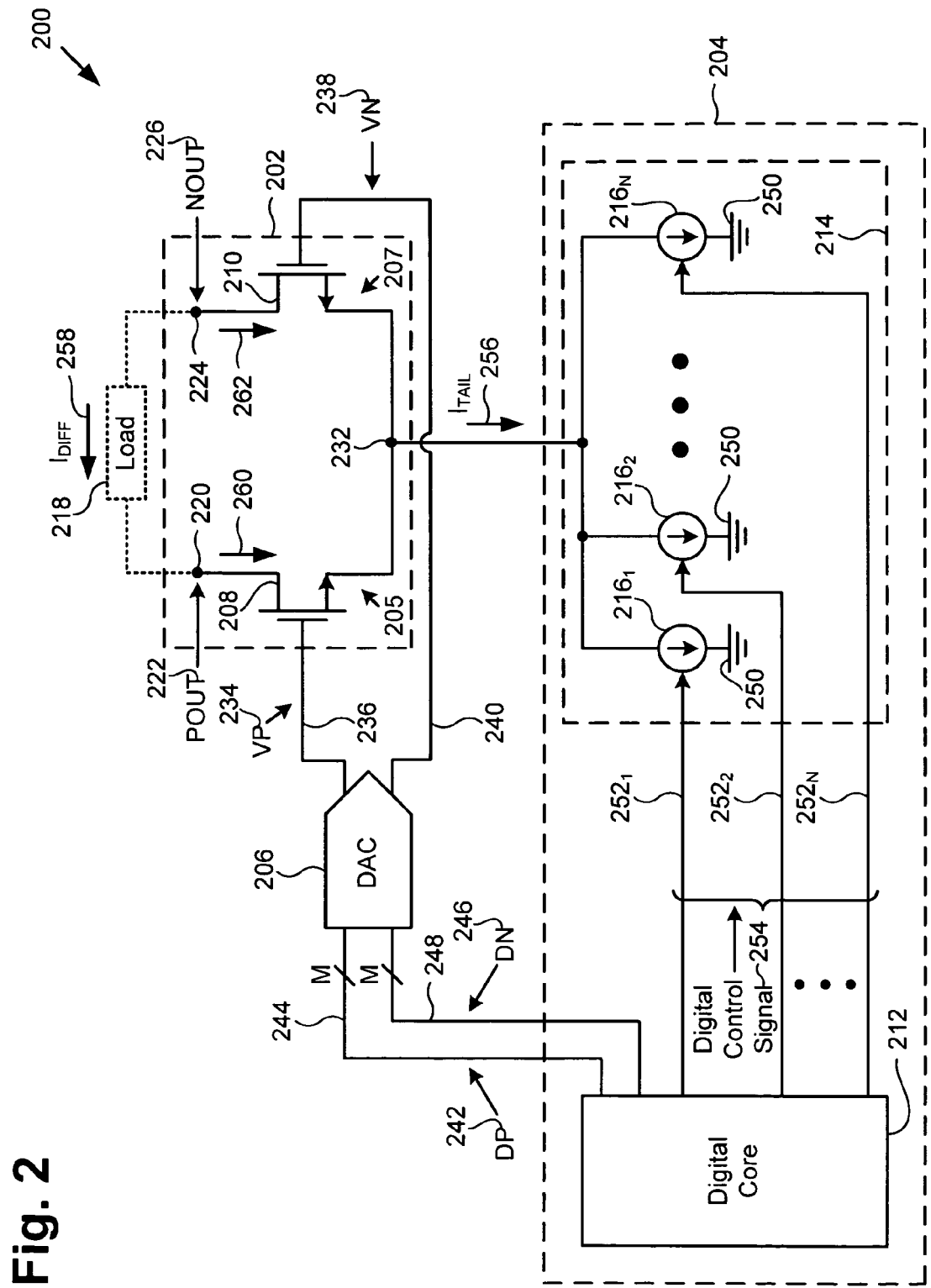
FIG. 2 illustrates a circuit diagram of an exemplary transmitter module including an exemplary tail current source and control circuit in accordance with one embodiment of the present invention.

FIG. 2 shows a circuit diagram of an exemplary transmitter module including an exemplary tail current source and control circuit in accordance with one embodiment of the present invention. Transmitter module 200 includes line driver portion 202, tail current source and control circuit 204, and digital-to-analog converter (DAC) 206. Line driver portion 202, which includes a portion of a line driver, such as a current mode line driver, is utilized to illustrate the present invention's tail current source and control circuit, which includes a digitally adjustable tail current source. However, the present invention can be generally applied to any line driver, such as a current mode line driver.

In FIG. 2, line driver portion 202 includes branch 205, which includes transistor 208, and branch 207, which includes transistor 210. Tail current source and control circuit 204 (also referred to simply as "current source and control circuit 204") includes digital core 212 and adjustable tail current source 214 (also referred to simply as "adjustable current source 214"). Adjustable current source 214, which is a digitally adjustable current source, includes current source cells $216_1$, $216_2$, ..., $216_N$. The invention's tail current source and control circuit 204 can be utilized to provide a digitally adjustable current source for a current mode line driver. For example, tail current source and control circuit 204 can be utilized in place of conventional tail current source 118 in FIG. 1 to provide a digitally adjustable tail current source for line driver 102.

As shown in FIG. 2, load 218, which can be a resistive load, is coupled between node 220, which provides positive output (POUT) 222 of line driver portion 202, and node 224, which provides negative output (NOUT) 226 of line driver portion 202. POUT 222 and NOUT 226 are differential outputs, such as, for example, differential current outputs. Also shown in FIG. 2, the drains of transistors 208 and 210 are coupled to respective nodes 220 and 224 and the sources of transistors 208 and 210 are coupled to adjustable current source 214 at node 232. Transistors 208 and 210 can each be an NFET, for example. Further shown in FIG. 2, voltage positive signal (VP) 234 is outputted by DAC 206 and is coupled to the gate of transistor 208 via line 236 and voltage negative signal (VN) 238 is outputted by DAC 206 and coupled to the gate of transistor 210 via line 240. VP 234 and VN 238 each comprise analog data, which corresponds to digital data generated by digital core 212.

Also shown in FIG. 2, data positive signal (DP) 242, which is a digital signal, is outputted by digital core 212 and inputted into DAC 206 via line 244 and data negative signal (DN) 246, which is the complement of DP 242, is generated by digital core 212 and inputted into DAC 206 via line 248. DP 242 and DN 246 can each comprise "M" bits of digital data. Digital core 212 can comprise control logic for a line driver, which can include line driver portion 202. Further shown in FIG. 2, current source cells $216_1$, $216_2$, ..., $216_N$ in adjustable current source 214 are coupled together in a parallel configuration between node 232 and ground 250, where "N" can be equal to "M" divided by 2. For example, in an embodiment in which DP 242 comprises 16 bits (i.e. "M"=16), "N" can be equal to 8. Each of current source cells $216_1$, $216_2$, ..., $216_N$ is a separate current source, which can be independently controlled. Each of current source cells $216_1$, $216_2$, ..., $216_N$ can be implemented by a current mirror including a single transistor or a cascode configuration, or can be implemented in a different manner as known in the art.

Also shown in FIG. 2, digital core 212 is coupled to control ports of current source cells $216_1$, $216_2$, ..., $216_N$ via control lines $252_1$, $252_2$, ..., $252_N$, respectively. Digital core 212 can be configured to provide digital control signal 254 on control lines $252_1$, $252_2$, ..., $252_N$ to control each of current source cells $216_1$, $216_2$, ..., $216_N$. Digital control signal 254 can comprise "N" bits, where each bit can be utilized to turn one of current source cells $216_1$, $216_2$, ..., $216_N$ on or off via a corresponding control line. Thus, for example, one bit of digital control signal 254 can be utilized to turn current source cell $216_1$ on or off via control line $252_1$, another bit of digital control signal 254 can be utilized to turn current source cell $216_2$ on or off via control line $252_2$, and so forth. Current source cells $216_1$, $216_2$, ..., $216_N$ can be configured to provide tail current ($I_{TAIL}$) 256 for a line driver, such as line driver 102 in FIG. 1, in response to digital control signal 254. $I_{TAIL}$ 256 can be drawn from a supply voltage (not shown in FIG. 2), such as VDD, which can be coupled to nodes 220 and 224 via inductors (not shown in FIG. 2), such as inductors 165 and 167 in FIG. 1.

The operation of transmitter module 200 will now be discussed. When transmitter module 200 is transmitting data, a difference in voltage between VP 234 and VN 238 causes difference current ($I_{DIFF}$) 258, which is the different in current between current 260, which flows through branch 205, and current 262, which flows through branch 207, to flow through load 218. The product of $I_{DIFF}$ 258 and the resistance of load 218 ($R_{LOAD}$) creates a voltage difference between nodes 220 and 224, which provide POUT 222 and NOUT 226 (i.e. the differential outputs). The maximum value of the transmitted signal occurs when $I_{DIFF}$ 258 is substantially equal to $I_{TAIL}$ 256, i.e., when $I_{TAIL}$ 256 is flowing through one branch (i.e. branch 205 or 207) and substantially zero current is flowing through the other branch.

$I_{TAIL}$ 256 is generated and controlled by an embodiment of the invention's current source and control circuit 204. In particular, $I_{TAIL}$ 256 is generated by adjustable current source 214, which is controlled by digital core 212 via digital control signal 254. Current source and control circuit 204 can be configured to support class A, class B, or class AB modes of operation of a line driver (represented by line driver portion 202), such as line driver 102 in FIG. 1. In a class A mode of operation, for example, a substantially constant $I_{TAIL}$ 256 can be provided, wherein current source cells $216_1$, $216_2$, ..., $216_N$ are turned on by digital control signal 254, and wherein the constant tail current can be set to be equal to at least a maximum value of $I_{DIFF}$ 258. In a class B mode of operation, for example, $I_{TAIL}$ 256 can be substantially equal to $I_{DIFF}$ 258, wherein current source cells $216_1$, $216_2$, ..., $216_N$ can be turned off by digital control signal 254 when DP 242 and DN 246 are not being outputted by digital core 212. When DP 242 and DN 246 are being outputted (i.e. generated) by digital core 212, each of current source cells $216_1$, $216_2$, ..., $216_N$ can be selectively turned on or off by digital control signal 254 to provide a required amount of tail current (i.e. $I_{TAIL}$ 256) to generate POUT 222 and NOUT 226 at respective nodes 220 and 224.

In a class AB mode of operation, for example, $I_{TAIL}$ 256 can be equal to $I_{DIFF}$ 258 plus a constant tail current ($I_{CONST}$). In one embodiment, when DP 242 and DN 246 are being outputted by digital core 212, a portion of each of current source cells $216_1$, $216_2$, ..., $216_N$ can be selectively turned on or off by a digital control signal, such as digital control signal 254, to provide a required amount of tail current (i.e. $I_{TAIL}$ 256) to generate POUT 222 and NOUT 226. When DP 242 and DN 246 are not being outputted by digital core 212, another portion of each of current source cells $216_1$, $216_2$, ..., $216_N$ can be turned on by the digital control signal to provide $I_{CONST}$. $I_{CONST}$, which is a minimum value of $I_{TAIL}$ 256 that can be provided when data is not being outputted by digital core 212, is design dependent and can be selected to provide a desired level of line driver speed and linearity.

Digital core 212 can be configured to determine a maximum and a minimum value of $I_{TAIL}$ 256, where the maximum value of $I_{TAIL}$ 256 can be determined by the amount of tail current required to transmit POUT 222 and NOUT 226 (i.e. the differential outputs) at maximum amplitude, and where the minimum value of $I_{TAIL}$ 256 can be determined by the amount of tail current required to meet line driver speed, linearity, and noise specifications. Digital core 212 can be further configured to provide a required amount of tail current ($I_{TAIL}$ 256) by providing digital control signal 254 to appropriately turn on or off each of current source cells $216_1$, $216_2$, ..., $216_N$ in adjustable current source 214. Since digital core 212 generates DP 242 and DN 246 and determines the maximum and minimum values of $I_{TAIL}$ 256, it (i.e. digital core 212) can determine how many steps of tail current are required to go from the minimum to the maximum value of $I_{TAIL}$ 256. As a result, digital core 212 can determine how many steps of tail current to turn on based on DP 242 and DN 246 (i.e. the digital data outputted by digital core 212).

Assuming, for example, that DP 242 and DN 246 each comprise 16 bits of data (i.e. "M"=16), the maximum value of $I_{TAIL}$ 256 is 48.0 milliamperes (mA), and the minimum value of $I_{TAIL}$ 256 is 0.0 mA. Since the data has a polarity, it can have a value of zero, one of eight positive steps, or one of eight negative steps, where each step can provide 6.0 mA of tail current. Since eight steps of tail current are required, adjustable current source 214 can include eight current source cells (i.e. current source cells $216_1$, $216_2$, ..., $216_N$, where "N"=8), where each current source cell can provide (or sink) 6.0 mA of tail current. Thus, to provide eight steps of tail current, digital control signal 254 can turn an appropriate number of the current source cells in adjustable current source 214. Although the data can become negative when it is converted into an analog form by DAC 206, the tail current always flows in the same direction (i.e. tail current is always sunk in adjustable current source 214). Thus, for negative and positive data, tail current can flow through different branches (i.e. branches 205 and 207) of line driver portion 202.

Thus, an embodiment of the invention's current source and control circuit 204 includes adjustable current source 214 including a plurality of current source cells $216_1$, $216_2$, ..., $216_N$, where each current source cell comprises a single current source that can be turned on or off by a bit of digital control signal 254, thereby providing a digitally adjustable line driver tail current. An embodiment of the invention can provide digital tail current control based on data bits and can also provide digital tail current control based on a selected line driver mode of operation, such as a class A, a class B, or a class AB mode of operation, which can be selected to be anywhere between class A and class B modes of operation.

By providing a digitally controlled tail current for a line driver, such as a current mode line driver, an embodiment of the invention can provide an amount of tail current that can accurate meet the requirements of the data inputted into the line driver. As a result, an embodiment of the invention can advantageously reduce line driver tail current consumption. In contrast, conventional tail current source 118 provides analog control of tail current. Thus, an embodiment of the invention's current source and control circuit 204 can provide reduced line driver tail current consumption compared to conventional tail current source 118.

Figure 3:
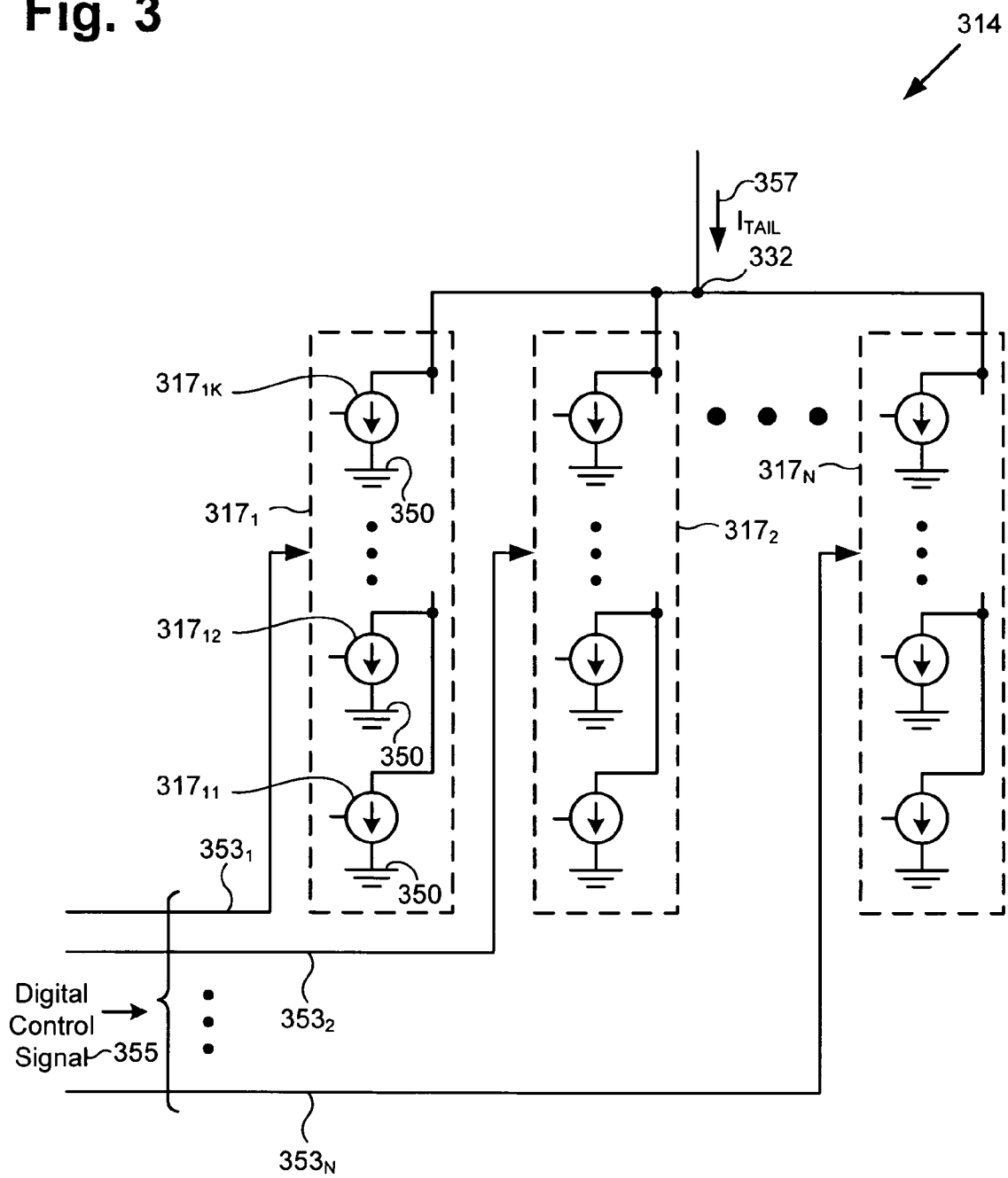
FIG. 3 illustrates a circuit diagram of an exemplary adjustable tail current source in accordance with one embodiment of the present invention.

FIG. 3 shows a circuit diagram of an exemplary adjustable tail current source in accordance with one embodiment of the present invention. Adjustable tail current source 314 (also referred to simply as "adjustable current source 314") in FIG. 3 can provide increased tail current control compared to adjustable current source 214 in FIG. 2. Adjustable current source 314 includes current source cells $317_1$, $317_2$, ..., $317_N$, where each of current source cells $317_1$, $317_2$, ..., $317_N$ includes a plurality of current source sub-cells. In FIG. 3, current source cell $317_1$ includes current source sub-cells $317_{11}$, $317_{12}$, ..., $317_{1K}$, where "K" can be equal to "N" in one embodiment. It is noted that only current source sub-cells $317_{11}$, $317_{12}$, ..., $317_{1K}$ are specifically discussed herein to preserve brevity.

As shown in FIG. 3, the current source sub-cells in each of current source cells $317_1$, $317_2$, ..., $317_N$ are coupled together in a parallel configuration between node 332 and ground 350, which correspond, respectively, to node 232 and ground 250 in FIG. 2. Also shown in FIG. 3, current source cells $317_1$, $317_2$, ..., $317_N$ are coupled to a digital core (not shown in FIG. 3), such as digital core 212 in FIG. 2) via respective control lines $353_1$, $353_2$, ..., $353_N$. Further shown in FIG. 3, digital control signal 355, which can be provided by digital core 212 in FIG. 2, is coupled to current source cells $317_1$, $317_2$, ..., $317_N$ via control lines $353_1$, $353_2$, ..., $353_N$. In one embodiment, control lines $353_1$, $353_2$, ..., $353_N$ can comprise "K" control lines (i.e. "N"="K"), where each of the "K" control lines can be coupled to a control port of one current source sub-cell, such as one of current source sub-cells $317_{11}$, $317_{12}, \ldots, 317_{1K}$. In such embodiment, each of the current source sub-cells in each of current source cells $317_1$, $317_2, \ldots, 317_N$ can be controlled (i.e. turned on or off) by a separate bit of digital control signal 355.

Adjustable current source 314 can be configured to provide $I_{TAIL}$ 357 for a line driver, such as line driver 102 in FIG. 2, in response to digital control signal 355, where the line driver can operate in a class A, a class B, or a class AB mode of operation. In a class AB mode of operation, for example, when a digital core (e.g. digital core 212 in FIG. 2) is outputting data (e.g. DP 242 and DN 246), digital control signal 355 can selectively turn on and off a first portion of current source sub-cells in each of current source cells $317_1, 317_2, \ldots, 317_N$ to provide a required amount of tail current (i.e. $I_{TAIL}$ 357) to generate a line driver output signal (e.g. POUT 222 and NOUT 226 in FIG. 2). When the digital core is not outputting data, a second portion of current source sub-cells in each of current source cells $317_1, 317_2, \ldots, 317_N$ can be turned on to provide a substantially constant tail current ($I_{CONST}$), which can be selected to provide a desired level of line driver speed and linearity.

Thus, in an embodiment of the invention's adjustable current source 314, each current source cell can comprise a plurality of current source sub-cells, such as current source sub-cells $317_{11}, 317_{12}, \ldots, 317_{1K}$, so as to provide a finer degree of digital control of line driver tail current.

Figure 4:
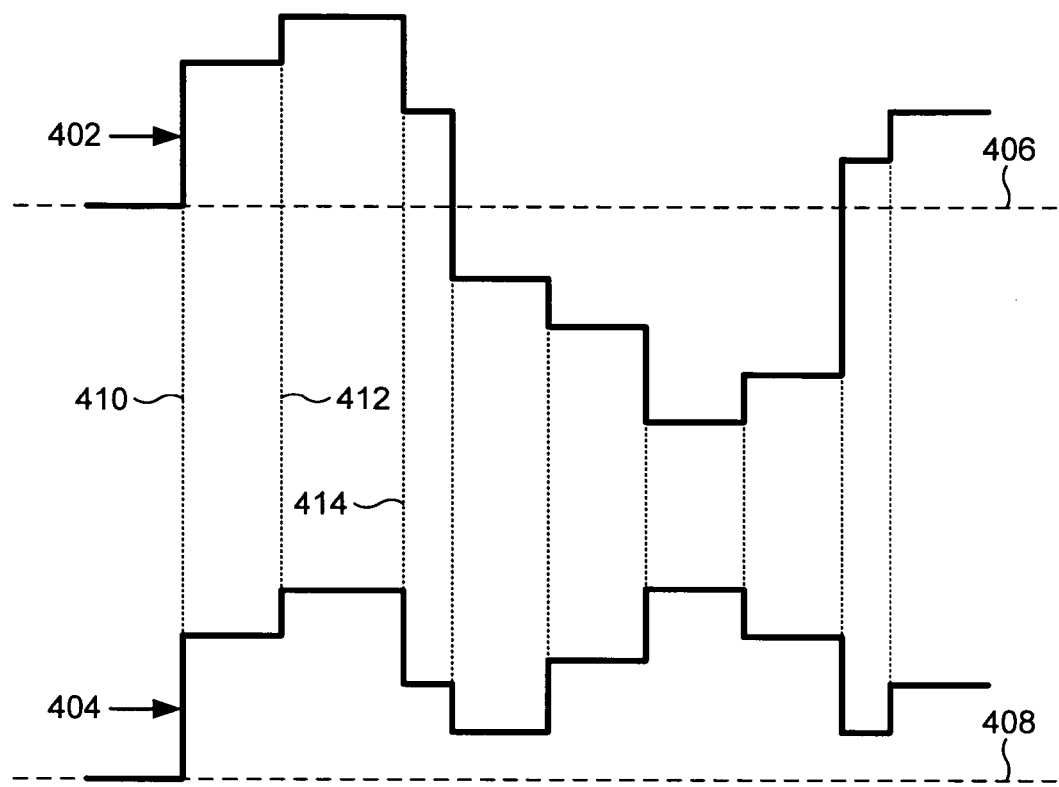
FIG. 4 illustrates an exemplary data waveform and a corresponding exemplary tail current waveform in accordance with one embodiment of the present invention.

FIG. 4 shows an exemplary data waveform and a corresponding exemplary tail current waveform in accordance with one embodiment of the present invention. In FIG. 4, data waveform 402 corresponds to analog data, such as VP 234 and VN 238, generated by a DAC, such as DAC 206 in FIG. 2, and inputted into a line driver, such as line driver portion 202. The analog data represented by data waveform 402 corresponds to digital data, such as DP 242 and DN 246, generated by a digital core, such as digital core 212. Tail current waveform 404 corresponds to a tail current, such as $I_{TAIL}$ 256, generated by an embodiment of the invention's adjustable current source, such as adjustable current source 214. In FIG. 4, dashed line 406 represents "0" data (i.e. when all data bits are equal to "0") and dashed line 408 represents "0" tail current.

As shown in FIG. 4, data waveform 402 extends above and below dashed line 406, which indicates the polarity of the data. However, tail current waveform 404 does not extend below dashed line 408, since tail current flows in only one direction. Thus, the tail current corresponds to the absolute value of the data. Also shown in FIG. 4, step changes in the data align with corresponding step changes in tail current, which is indicated by dashed lines, such as dashed lines 410, 412, and 414. As discussed above, the digital core generates digital data corresponding to the analog data inputted into the line driver. The digital core also generates a digital control signal, such as digital control signal 354, which controls the tail current provided by an adjustable current source by selectively turning on or off each current source cell in the adjustable current source. In one embodiment, the digital core can be configured to control the tail current such that a step transition in tail current occurs concurrently with a corresponding step transition in the data (i.e. the analog data inputted into the liner), as indicated by dashed lines 410, 412, and 414 in FIG. 4.

Figure 5:
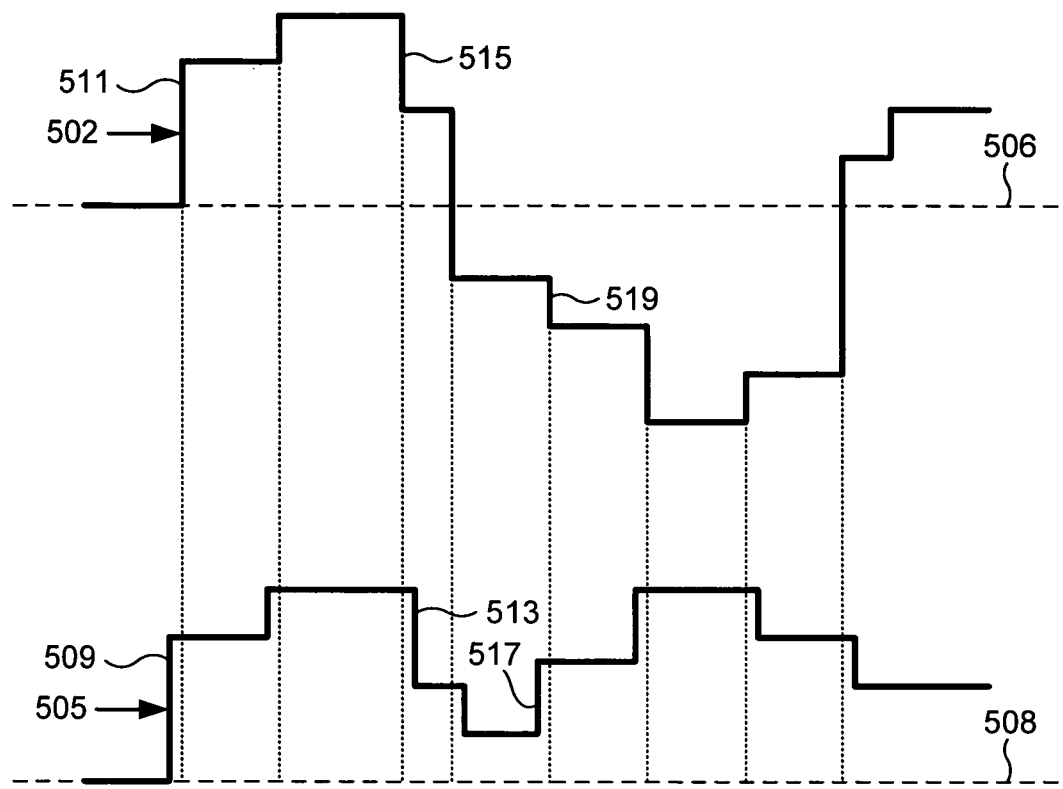
FIG. 5 illustrates an exemplary data waveform and a corresponding exemplary tail current waveform in accordance with one embodiment of the present invention.

FIG. 5 shows an exemplary data waveform and a corresponding exemplary tail current waveform in accordance with one embodiment of the present invention. In FIG. 5, data waveform 502 and dashed lines 506 and 508 correspond, respectively, to data waveform 402 and dashed lines 406 and 408 in FIG. 4. In FIG. 5, tail current waveform 504 corresponds to a tail current, such as $I_{TAIL}$ 256, generated by an embodiment of the invention's adjustable current source, such as adjustable current source 214. However, in contrast to tail current in FIG. 4, the step transitions in tail current in FIG. 5 do not occur concurrently with respective corresponding step transitions in the data.

As shown in FIG. 5, a step increase in tail current occurs prior to a corresponding step increase in the absolute value of the data, and a step decrease in tail current occurs after a corresponding step decrease in the absolute value of the data. For example, edge 509, which indicates a step increase in tail current, occurs before edge 511, which indicates a corresponding step increase in the absolute value of the data. For example, edge 513, which indicates a step decrease in tail current, occurs after edge 515, which indicates a corresponding step decrease in the absolute value of the data. For example, edge 517, which indicates a step increase in tail current, occurs before edge 519, which indicates a corresponding step increase in the absolute value of the data.

In the embodiment in FIG. 5, the digital core, such as digital core 212, can be configured to control the tail current so as to provide a wider tail current envelope for analog data inputted into a line driver, where the analog data corresponds to digital data generated by the digital core. The digital core can control the tail current via a digital control signal, such as digital control signal 254 in FIG. 2, wherein a step increase in tail current occurs prior to a corresponding step increase in the absolute value of the analog data, and a step decrease in tail current occurs after a corresponding step decrease in the absolute value of the analog data. By providing a wider tail current envelope for the analog data inputted into the line driver, an embodiment of the invention ensures that sufficient tail current is available to the line driver as required to generate the output signal.

Thus, as discussed above, the present invention provides an adjustable tail current source coupled to a digital core, where the adjustable tail current source is digitally controlled by the digital core so as to provide a tail current for a line driver, such as a current mode line driver. By digitally controlling the adjustable tail current source to provide a tail current, the invention can advantageously reduce line driver tail current consumption compared to a conventional tail current source.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A circuit for providing a tail current for a line driver, said circuit comprising:
   an adjustable current source, said adjustable current source comprising a plurality of current source cells coupled in parallel;
   said plurality of current source cells being configured to provide said tail current for said line driver in response to a digital control signal;

wherein said line driver comprises at least two transistors whose sources are coupled to said adjustable current source and whose gates are coupled to a DAC.

2. The circuit of claim 1 further comprising a digital core coupled to said adjustable current source, wherein said digital core provides said digital control signal.

3. The circuit of claim 2, wherein said digital core generates digital data corresponding to analog data inputted into said line driver, and wherein said digital core is configured to cause a step transition in said tail current to occur concurrently with a corresponding step transition in said analog data.

4. The circuit of claim 2, wherein said digital core generates digital data corresponding to analog data inputted into said line driver, and wherein said digital core is configured to cause said tail current to be increased prior to a corresponding increase in an absolute value of said analog data and to be decreased after a corresponding decrease in said absolute value of said analog data.

5. The circuit of claim 2, wherein each of said plurality of current source cells is coupled to said digital core via a separate control line.

6. The circuit of claim 1, wherein said digital control signal comprises a plurality of bits, and wherein each of said plurality of bits controls one of said plurality of current source cells.

7. The circuit of claim 1, wherein each of said plurality of current source cells comprises a plurality of current source sub-cells coupled in parallel.

8. The circuit of claim 7, wherein said digital control signal comprises a plurality of bits, and wherein each of said plurality of bits controls one of said plurality of current source sub-cells.

9. The circuit of claim 7, wherein a first portion of said plurality of current source sub-cells is turned on and off when data is being inputted into said line driver in a class AB mode of operation and a second portion of said plurality of current source sub-cells is turned on when said data is not being inputted into said line driver.

10. The circuit of claim 1, wherein said plurality of current source cells are configured to provide said tail current for said line driver in response to said digital control signal when said line driver is operating in a class AB mode of operation.

11. A transmitter module including a circuit for providing a tail current for a line driver, said circuit comprising:
an adjustable current source, said adjustable current source comprising a plurality of current source cells coupled in parallel;
a digital core for providing a digital control signal to said adjustable current source;
a DAC coupled between said digital core and said line driver;
said plurality of current source cells being configured to provide said tail current for said line driver in response to said digital control signal;
wherein said line driver comprises at least two transistors whose sources are coupled to said adjustable current source and whose gates are coupled to said DAC.

12. The transmitter module of claim 11, wherein said digital control signal comprises a plurality of bits, and wherein each of said plurality of bits controls one of said plurality of current source cells.

13. The transmitter module of claim 11, wherein each of said plurality of current source cells is coupled to said digital core via a separate control line.

14. The transmitter module of claim 11, wherein each of said plurality of current source cells comprises a plurality of current source sub-cells coupled in parallel.

15. The transmitter module of claim 14, wherein said digital control signal comprises a plurality of bits, and wherein each of said plurality of bits controls one of said plurality of current source sub-cells.

16. The transmitter module of claim 14, wherein a first portion of said plurality of current source sub-cells is turned on and off when data is being inputted into said line driver in a class AB mode of operation and a second portion of said plurality of current source sub-cells is turned on when said data is not being inputted into said line driver.

17. The transmitter module of claim 14, wherein each of said plurality of current source cells is coupled to said digital core via a separate control line.

18. The transmitter module of claim 11, wherein said digital core generates digital data corresponding to analog data inputted into said line driver, and wherein said digital core is configured to cause a step transition in said tail current to occur concurrently with a corresponding step transition in said analog data.

19. The transmitter module of claim 11, wherein said digital core generates digital data corresponding to analog data inputted into said line driver, and wherein said digital core is configured to cause said tail current to be increased prior to a corresponding increase in an absolute value of said analog data and to be decreased after a corresponding decrease in said absolute value of said analog data.

20. The transmitter module of claim 11, wherein said plurality of current source cells are configured to provide said tail current for said line driver in response to said digital control signal when said line driver is operating in a class AB mode of operation.

* * * * *